（12）United States Patent
Liu et al.

(10) Patent No.: US 9,695,039 B1
(45) Date of Patent: Jul. 4, 2017

(54) MULTI-PRESSURE MEMS PACKAGE

(71) Applicant: Taiwan Semiconductor Manufacturing Co., Ltd., Hsin-Chu (TW)

(72) Inventors: Yu-Chia Liu, Kaohsiung (TW);
Chia-Hua Chu, Zhubei (TW);
Chun-Wen Cheng, Zhubei (TW);
Kuei-Sung Chang, Kaohsiung (TW);
Jung-Huei Peng, Jhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/143,762

(22) Filed: May 2, 2016

Related U.S. Application Data

(60) Provisional application No. 62/312,603, filed on Mar. 24, 2016.

(51) Int. Cl.
*H01L 21/00* (2006.01)
*B81B 7/04* (2006.01)
*B81C 1/00* (2006.01)

(52) U.S. Cl.
CPC ............ *B81B 7/04* (2013.01); *B81C 1/00301* (2013.01); *B81B 2201/0235* (2013.01); *B81B 2201/0242* (2013.01); *B81B 2203/0315* (2013.01); *B81B 2207/094* (2013.01); *B81C 2201/013* (2013.01); *B81C 2203/0109* (2013.01)

(58) Field of Classification Search
CPC ......... H01L 2224/97; H01L 2924/1461; H01L 24/97; H01L 25/0657
USPC ....................... 438/50, 52; 257/415
See application file for complete search history.

(56) References Cited

U.S. PATENT DOCUMENTS 8,201,452 B2 * 6/2012 Oldsen ................. B81B 3/0051
73/514.26
2013/0277777 A1 * 10/2013 Chang ...................... B81B 7/00
257/418

* cited by examiner

*Primary Examiner* — Theresa T Doan
(74) *Attorney, Agent, or Firm* — Eschweiler & Potashnik, LLC

(57) ABSTRACT

The present disclosure relates to a microelectromechanical systems (MEMS) package having two MEMS devices with different pressures, and an associated method of formation. In some embodiments, the (MEMS) package includes a device substrate and a cap substrate bonded together. The device substrate includes a first trench and a second trench. A first MEMS device is disposed over the first trench and a second MEMS device is disposed over the second trench. A first stopper is raised from a first trench bottom surface of the first trench but below a top surface of the device substrate and a second stopper is raised from a second trench bottom surface of the second trench but below the top surface of the device substrate. A first depth of the first trench is greater than a second depth of the second trench.

20 Claims, 7 Drawing Sheets

MULTI-PRESSURE MEMS PACKAGE

REFERENCE TO RELATED APPLICATION

This Application claims priority to U.S. Provisional Application No. 62/312,603 filed on Mar. 24, 2016, the contents of which is hereby incorporated by reference in its entirety.

BACKGROUND

Microelectromechanical systems (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones. For some applications, various MEMS devices need to be integrated into one MEMS package; these may include some MEMS sensors requiring different pressures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
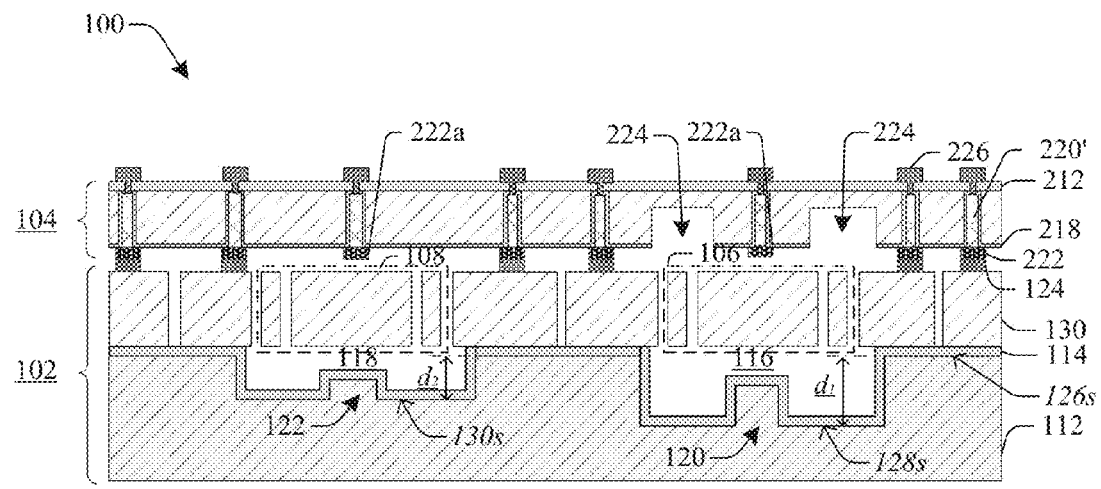
FIG. 1 illustrates a cross-sectional view of some embodiments of a microelectromechanical systems (MEMS) package having multiple MEMS devices with different cavity depths.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

In recent generations of MEMS ICs, multiple MEMS devices may be integrated onto one integrated chip. For example, motion sensors are used for motion-activated user interfaces in consumer electronics such as smart phones, tablets, gaming consoles, smart-TVs, and in automotive crash detection systems. To capture a complete range of movements within a three-dimensional space, motion sensors often utilize an accelerometer and a gyroscope in combination. The accelerometer detects linear movement. The gyroscope detects angular movement. To meet consumer demands for low cost, high quality, and small device footprint, the accelerometer and the gyroscope can be integrated together on one substrate of a microelectromechanical system (MEMS) package.

The present disclosure is directed to a MEMS package comprising multiple MEMS devices that are integrated together on a single substrate with different cavity depths, and an associated method of formation. In some embodiments, the MEMS package comprises a device substrate and a cap substrate. The device substrate comprises a first trench and a second trench. A first MEMS device and a second MEMS device are respectively disposed over the first trench and the second trench. The cap substrate is bonded to the device substrate, enclosing a first cavity over the first MEMS device and a second cavity over the second MEMS device. A first stopper is raised from a first trench bottom surface of the first trench but below a top surface of the device substrate and a second stopper is raised from a second trench bottom surface of the second trench but below the top surface of the device substrate. A first depth of the first trench is greater than a second depth of the second trench. By forming cavities with different depths and stoppers within the cavities, varied vacuum levels can be achieved for multiple MEMS devices, and over movement or stiction of the MEMS devices can be reduced by the stoppers.

FIG. 1 shows a cross-sectional view of a MEMS package 100 having multiple MEMS devices with different cavity depths according to some embodiments. The MEMS package 100 comprises a device substrate 102 and a cap substrate 104. In some embodiments, the device substrate 102 may comprise a semiconductor substrate 112. A first trench 116 is disposed within the semiconductor substrate 112 from a top surface 126s to a first trench bottom surface 128s of the first trench 116 with a first vertical depth $d_1$. A first stopper 120 is raised from the first trench bottom surface 128s but below the top surface 126s of the semiconductor substrate 112. A second trench 118 is disposed apart from the first trench 116 within the semiconductor substrate 112 from the top surface 126s to a second trench bottom surface 128s of the second trench 118 with a second vertical depth $d_2$, which is smaller than the first vertical depth $d_1$. A second stopper 122 is raised from the second trench bottom surface 128s but below the top surface 126s. In some embodiments, the device substrate 102 further comprises a MEMS substrate 130 bonded to the semiconductor substrate 112. The MEMS substrate 130 includes a first MEMS device 106 overlying the first trench 116 and a second MEMS device 108 overlying the second trench 118. The cap substrate 104 is boned to the device substrate 102, enclosing the first MEMS device 106 within a first cavity and the second MEMS device 108 within a second cavity. The first trench 116 is a part of the first cavity and the second trench 118 is a part of the second cavity. In some embodiments, the first cavity is hermetically sealed and filled with a first gas at a first gas pressure; while the second cavity is hermetically sealed and filled with a second gas at a second gas pressure, which is different from the first gas pressure. By forming varied MEMS devices (e.g. the first MEMS device 106 and the second MEMS device 108) with different cavity depths and different pressures within the cavities, performance of the MEMS package 100 can be improved. For example, performance of a motion sensor having the first MEMS device 106 including a gyroscope, and the second MEMS device 108 including an accelerometer can be improved by separately controlling the pressures within the first and second cavities, which separately optimizes function of the first and second MEMS devices 106, 108 (i.e., the gyroscope and the accelerometer). In addition, by forming stoppers (e.g. the first stopper 120 and the second stopper 122) within the cavities, stiction of the MEMS devices, which can happen either during fabrication process or during operations, would be reduced.

In some embodiments, the device substrate 102 and the cap substrate 104 are bonded through a first bonding metal layer 124 disposed on the device substrate 102 and a second bonding metal layer 222 disposed on the cap substrate 104. In some embodiments, a portion of the second bonding metal layer 222 is disposed directly above the first MEMS device 106 or the second MEMS device 108, and configured as an upper stopper 222a to prevent over movement or stiction of the first MEMS device 106 or the second MEMS device 108.

In some embodiments, the cap substrate 104 further comprises a plurality of polysilicon pillars 220' extending through the cap substrate 104 and electrically coupled to the first MEMS device 106 or the second MEMS device 108 through the first bonding metal layer 124 and the second bonding metal layer 222. Contact pads 226 are disposed at a back side surface of the cap substrate 104 and in contact with the polysilicon pillars 220' respectively. In some embodiments, the first MEMS device 106 and the second MEMS device 108 are electrically coupled to bias sources or sensing signal detection units through the contact pads 226. In some embodiments, the upper stopper 220a is connected to the ground through one of the contact pads 226.

In some embodiments, a first dielectric liner 114 is conformally disposed along an upper surface of the semiconductor substrate 112 under the MEMS substrate 130. The first dielectric liner 114 extends along sidewall and bottom surfaces of the first trench 116 and the second trench 118. A second dielectric liner 218 is conformally disposed along an upper surface of the cap substrate 104 and extends between the polysilicon pillars 220' and the cap substrate 104. In some embodiments, the first dielectric liner 114 and the second dielectric liner 218 comprise oxide layer such as silicon dioxide. Also, a dielectric layer 212 can be disposed on the back side surface of the cap substrate 104 and extends between the cap substrate 104 and the contact pads 226.

In some embodiments, the cap substrate 104 further comprises a recess 224 in the front side of the cap substrate 104, overlying the first MEMS device 106 and acting as a part of the first cavity. The recess 224 may have a ring shape and a raised platform of the cap substrate 104 is disposed inside the ring shape and coplanar with a top surface of the cap substrate 104. The upper stopper 222a can be disposed on the raised platform on the top surface of the cap substrate 104 between the first portion 224a and the second portion 224b.

FIGS. 2-18 show a series of cross-sectional views that collectively depict formation of a MEMS package according to some embodiments.

Figure 2:
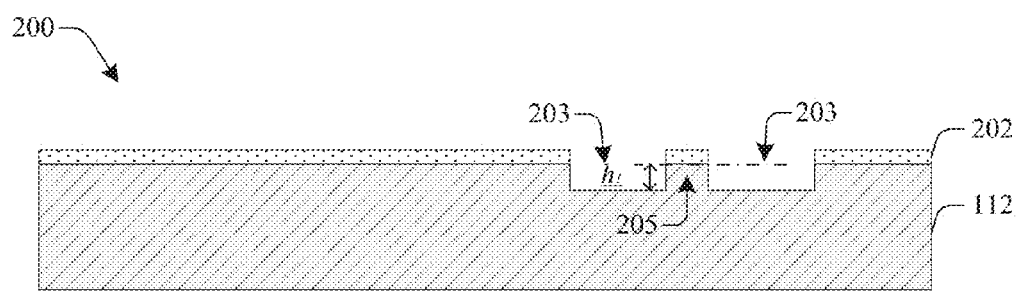
FIGS. 2-18 illustrate a series of cross-sectional views of some embodiments of a MEMS package at various stages of manufacture.

As shown in cross-sectional view 200 of FIG. 2, a semiconductor substrate 112 is provided. In some embodiments, the semiconductor substrate 112 is a bulk silicon substrate which has been prepared through one or more fabrication processes with varies doping regions. For example, the semiconductor substrate 112 may include one or more active elements and/or a series of metallization wires and via interconnects disposed within an IMD layer. In some alternative embodiments, the semiconductor substrate 112 can be implemented as a binary compound substrate (e.g., GaAs wafer), a ternary compound substrate (e.g., AlGaAs), or higher order compound wafers, among others. Further, the substrate 102 can also include non semiconductor materials such as oxide in silicon-on-insulator (SOI), partial SOI substrate, polysilicon, amorphous silicon, or organic materials, among others. The semiconductor substrate 112 can also include wafers which are cut from a silicon ingot, and/or any other type of semiconductor/non-semiconductor and/or deposited or grown (e.g. epitaxial) layers formed on an underlying substrate.

A first mask layer is formed and patterned over the semiconductor substrate 112 to form a first mask 202. In some embodiments, the first mask layer comprises a photoresist material and can be spray coated, curtain coated or spin coated to the semiconductor substrate 112. A first etching process is performed according to the first mask 202 to form a first intermediate trench 203 at a first position corresponding to a first trench 116 to be formed (shown in FIG. 7). In some embodiments, the first intermediate trench 203 is formed to have a ring shape, and a first stopper position 205 of the semiconductor substrate 112 within the ring shaped first intermediate trench 203 is protected by the first mask 202 from the first etching process. In some embodiments, the first intermediate trench 203 is formed by one or more of a wet etching process or a dry etching process. The first mask 202 may be subsequently removed after the first etching process. In some embodiments, the first intermediate trench 203 is formed with a height $h_1$ smaller than about 10 μm.

Figure 3:
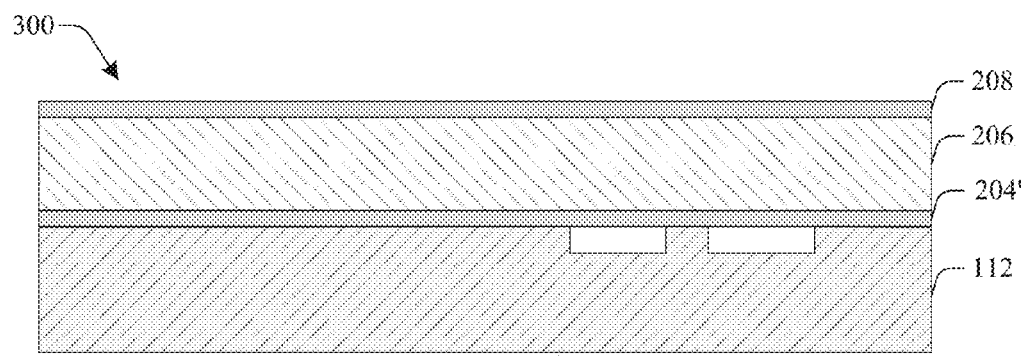

As shown in cross-sectional view 300 of FIG. 3, a first intermediate substrate 206 is provided and bonded to the semiconductor substrate 112. In some embodiments, the first intermediate substrate 206 is a bulk substrate. Prior to the bonding process, a hard mask layer 204' is formed on a front side of the first intermediate substrate 206. In some embodiments, the hard mask layer 204' is an oxide layer. The hard mask layer 204' may be formed by performing a thermal oxidation process to deposit the oxide layer onto the first intermediate substrate 206. An additional oxide layer 208 may be formed on a back side of the semiconductor substrate 112 after the thermal oxidation process. The semiconductor substrate 112 and the first intermediate substrate 206 may be bonded through a fusion bond between the hard mask layer 204' and the semiconductor substrate 112. In some embodiments, the hard mask layer 204' may be formed with a thickness from about 0.5 μm to about 1 μm.

Figure 4:
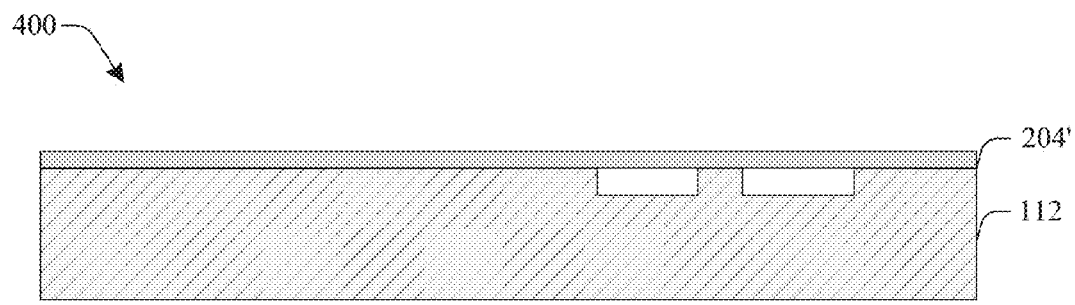

As shown in cross-sectional view 400 of FIG. 4, the first intermediate substrate 206 (and the additional oxide layer 208 if formed in FIG. 3) is removed to expose the hard mask layer 204'. The first intermediate substrate 206 may be removed by a wafer grinding processed and/or a silicon blanket etch process. Thus the hard mask layer 204' has a planar top surface across the first intermediate trench 203. The hard mask layer 204' is not formed along sidewall and bottom surfaces of the first intermediate trench 203 and therefore not affected by a step height of the first intermediate trench 203.

Figure 5:
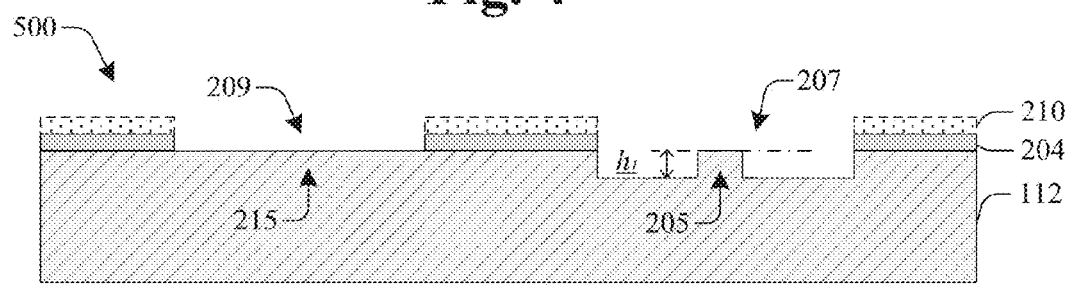

As shown in cross-sectional view 500 of FIG. 5, the hard mask layer 204' is patterned to form a hard mask 204. The hard mask 204 exposes a first position 207 corresponding to the first trench and a second position 209 corresponding to a second trench 118 to be formed (shown in FIG. 7). The hard mask 204 also exposes the first stopper position 205 within the first position 207 and the second stopper position 215 within the second position 209. In some embodiments, the hard mask 204 is patterned according to a photoresist mask 210 that can be spray coated, curtain coated or spin coated onto the hard mask layer 204'.

Figure 6:
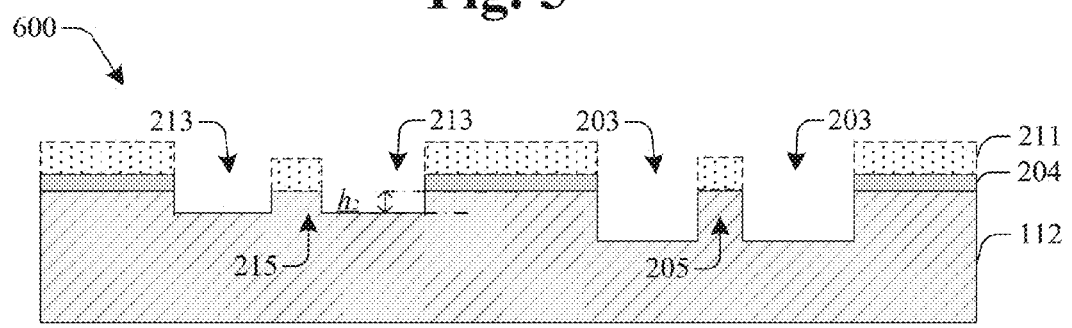

As shown in cross-sectional view 600 of FIG. 6, a second etching process is performed according to a second mask 211 to form a second intermediate trench 213 at the second position 209 (shown in FIG. 4) corresponding to the second trench. The second stopper position 215 of the semiconductor substrate 112 within the second intermediate trench 213 is protected by the second mask 211 from the second etching process. The first stopper position 205 of the semiconductor substrate 112 within the first intermediate trench 203 is also protected by the second mask 211 from the second etching process. The first intermediate trench 203 is concurrently etched to be deeper by the second etching process. In some embodiments, the second mask 211 comprises a photoresist material and can be spray coated, curtain coated or spin coated onto the hard mask 204 and the semiconductor substrate 112. In some embodiments, the second etching process comprises one or more of wet etching processes and/or dry etching processes. The second mask 211 may be subsequently removed after the second etching process. In some embodiments, the second intermediate trench 213 is formed with a height $h_2$ in a range of from about 20 μm to about 30 μm.

Figure 7:
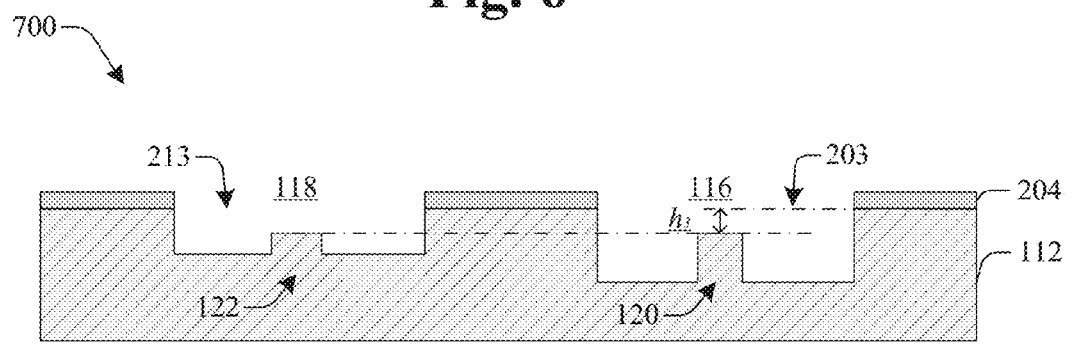

As shown in cross-sectional view 700 of FIG. 7, a third etching process is performed according to the hard mask 204 (formation shown in FIG. 5) to further etch the first intermediate trench 203 and the second intermediate trench 213 with the first and second stopper positions 205, 215 (shown in FIG. 6) exposed and etched concurrently, to form the first trench 116, the second trench 118, and a first stopper 120 and a second stopper 122. In some embodiments, the third etching process comprises one or more of wet etching processes and/or dry etching processes. The hard mask 204 may be subsequently removed after the third etching process. In some embodiments, the first stopper 120 and the second stopper 122 are coplanar and lowered from a top surface of the semiconductor substrate 112 with a height $h_3$ in a range of from about 5 μm to about 10 μm.

Figure 8:
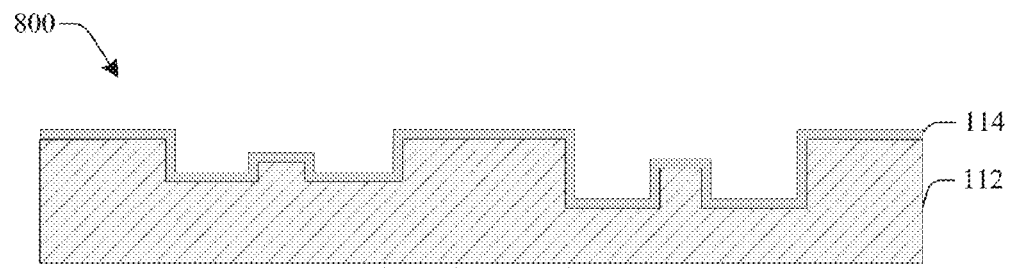

As shown in cross-sectional view 800 of FIG. 8, a first dielectric liner 114 is conformally deposited along an upper surface of the semiconductor substrate 112. In some embodiments, the first dielectric liner 114 comprises an oxide layer such as a silicon dioxide layer having a thickness greater than 1 μm. The first dielectric liner 114 may be formed by a thermal oxidation process.

Figure 9:
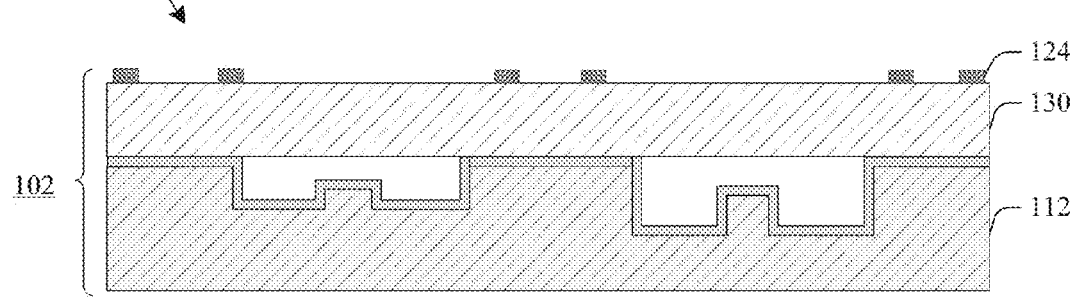

As shown in cross-sectional view 900 of FIG. 9, a MEMS substrate 130 is then bonded to the semiconductor substrate 112 to form a device substrate 102. In some embodiments, the MEMS substrate 130 is a bulk substrate. For example, the MEMS substrate 130 can be bonded to the first dielectric liner 114 by a fusion bonding process. In some embodiments, a fusion bonding is achieved between the first dielectric liner 114 comprising $SiO_2$ and the MEMS substrate 130 comprising silicon. In some embodiments, the MEMS substrate 130 and/or the semiconductor substrate 112 is thinned down to reduce the thickness thereof after the fusion bonding. In some embodiments, a first bonding metal layer 124 is deposited and patterned to form bonding pads or bonding rings over the device substrate 102.

Figure 10:
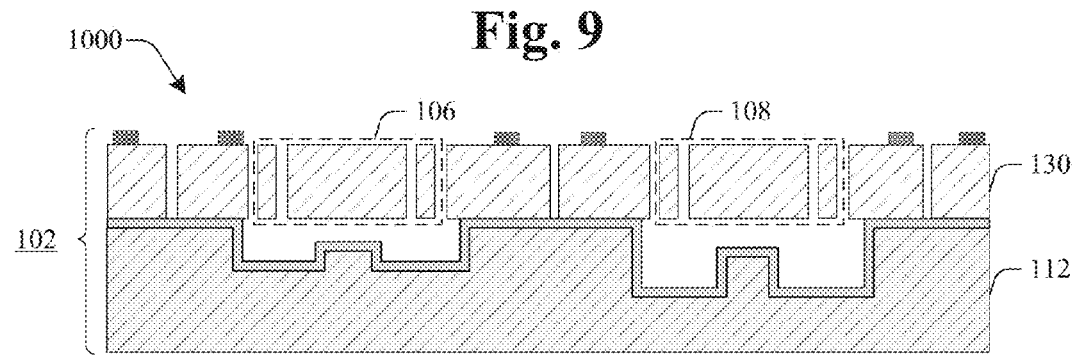

As shown in cross-sectional view 1000 of FIG. 10, the MEMS substrate 130 is patterned to form a first MEMS device 106 and a second MEMS device 108. In some embodiments, the MEMS substrate 130 is patterned by a photoresist mask, which may be subsequently removed after the patterning. In some embodiments, the first MEMS device 106 and the second MEMS device 108 are formed by one or more of wet etching processes and/or dry etching processes.

FIGS. 11-15 show cross-sectional views of preparing a cap substrate 104 according to some embodiments. By utilizing a dielectric layer 212 as an etch stop layer and preparing through substrate vias (TSVs) on a support substrate 230, thickness uniformity of the TSVs is better controlled. Accordingly, electrical properties of the MEMS package are improved.

Figure 11:
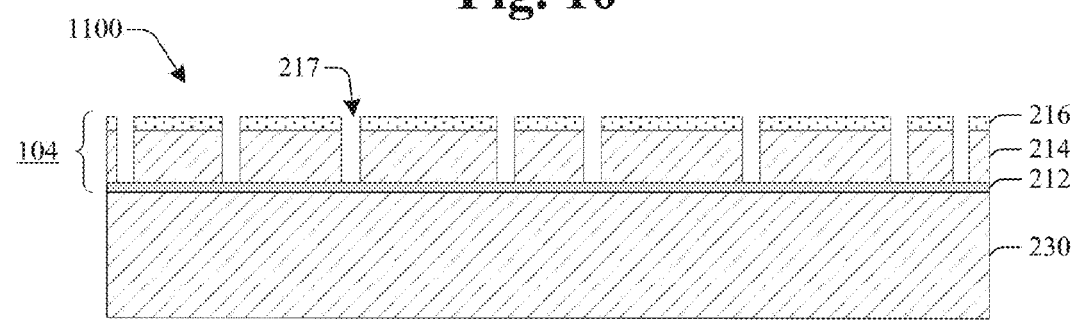

As shown in cross-sectional view 1100 of FIG. 11, a silicon-on-insulator (SOI) substrate is provided including a semiconductor substrate 214 disposed over a dielectric layer 212 and an underneath support substrate 230. In some embodiments, the semiconductor substrate 214 is patterned according to a mask layer 216 to form a plurality of TSV holes 217. The semiconductor substrate 214 may be a silicon layer with a thickness in a range of from about 40 μm to about 60 μm. In some embodiments, the mask layer 216 comprises photoresist, which may be subsequently removed after the patterning. In some embodiments, the TSV holes 217 are formed by one or more of wet etching processes and/or dry etching processes that stop on the dielectric layer 212. Thus depths of the TSV holes 217 become uniform with one another.

Figure 12:
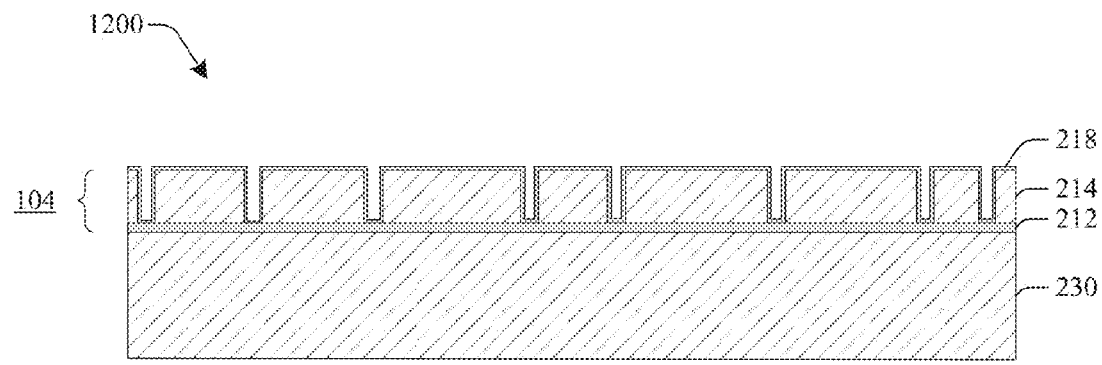

As shown in cross-sectional view 1200 of FIG. 12, a second dielectric liner 218 is conformally deposited along an upper surface of the semiconductor substrate 214 and extends along sidewalls of the TSV holes 217. In some embodiments, the second dielectric liner 218 comprises an oxide layer such as silicon dioxide having a thickness in a range of from about 0.5 μm to about 1 μm. The second dielectric liner 218 may be formed by a thermal oxidation process.

Figure 13:
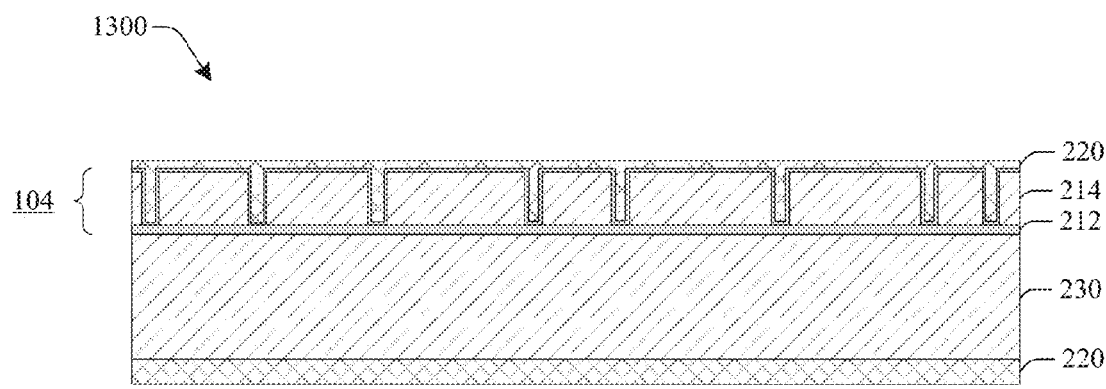

As shown in cross-sectional view 1300 of FIG. 13, a conductive material 220 is deposited to fill in the TSV holes 217 and extend over the semiconductor substrate 214. In some embodiments, the conductive material 220 comprises polysilicon. The conductive material 220 may be formed by a deposition process, such as a physical vapor deposition or a chemical vapor deposition process, followed by a planarization process, such as a chemical-mechanical polishing process. In some embodiments, the conductive material 220 is also deposited on a back side of the semiconductor substrate 214.

Figure 14:
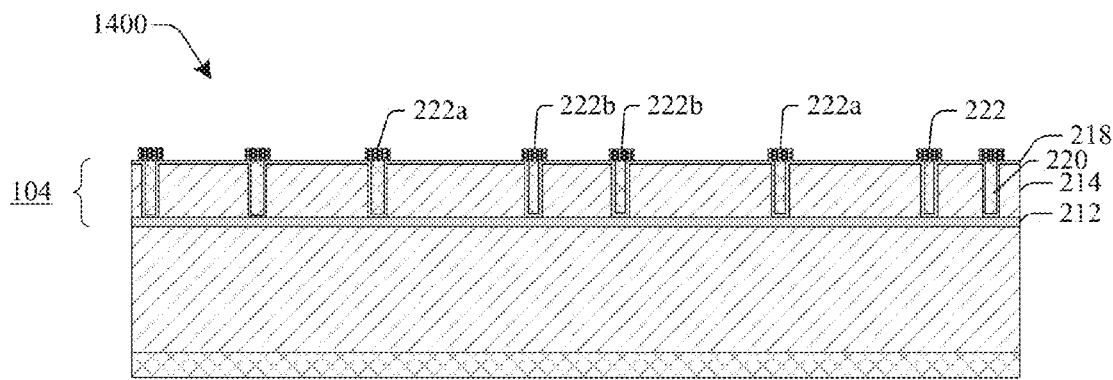

As shown in cross-sectional view 1400 of FIG. 14, the conductive material 220 is further reduced to have an upper surface aligned with an upper surface of the second dielectric liner 218. In some embodiments, a second bonding metal layer 222 is deposited and patterned at a front side of the cap substrate 104 in contact with the conductive material 220. The second bonding metal layer 222 includes an upper stopper 222a disposed at a position corresponding to the first MEMS device 106 or the second MEMS device 108 and a bonding pad 222b disposed at a position corresponding to the first bonding metal layer 124 of the device substrate 102.

Figure 15:
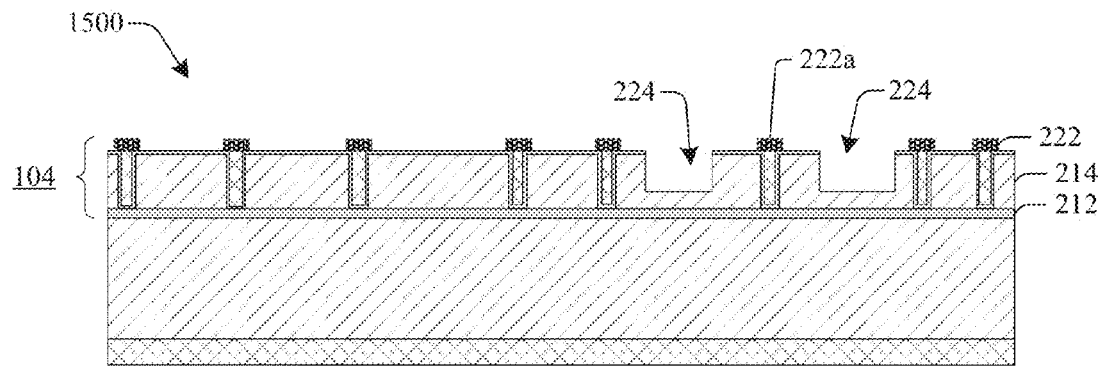

As shown in cross-sectional view 1500 of FIG. 15, a recess 224 is formed in the front side of the cap substrate 104. The recess 224 is located at a position overlying the first MEMS device 106 and configured as a part of the first cavity. In some embodiments, the recess 224 has a ring shape with a raised platform disposed inside the ring and coplanar with the front side of the cap substrate 104. The upper stopper 222a is formed on the raised platform, and configured to prevent over movement or stiction of the first MEMS device 106.

Figure 16:
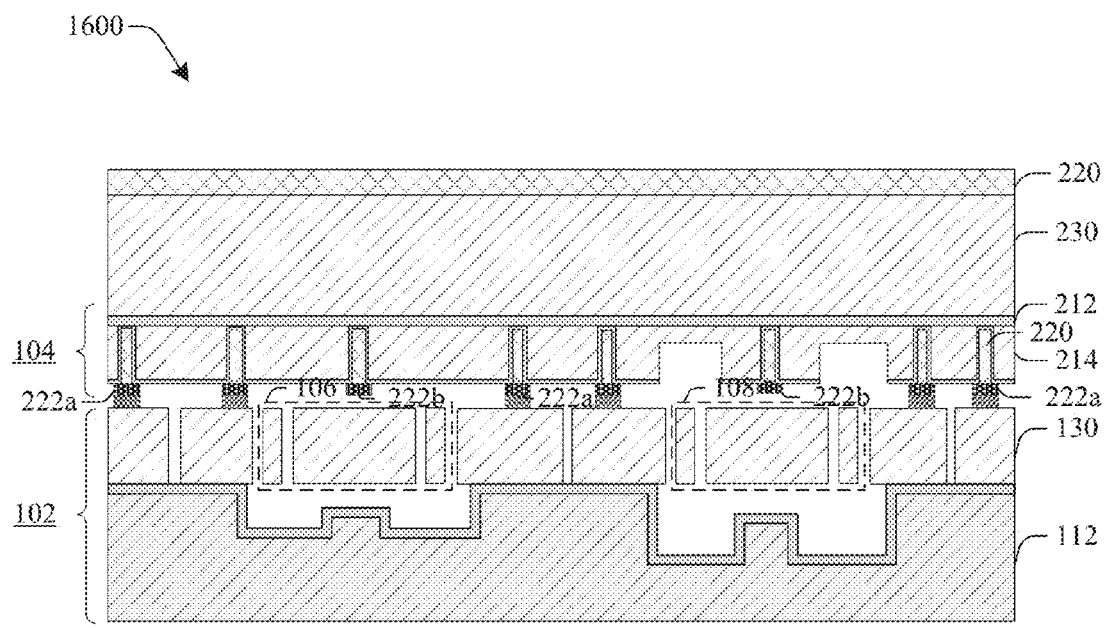

As shown in cross-sectional view 1600 of FIG. 16, the cap substrate 104 is bonded to the device substrate 102 through the second bonding metal layer 222 and the first bonding metal layer 124. In some embodiments, the first bonding metal layer 124 and the second bonding metal layer 222 can be made of metals such as aluminum (Al), germanium (Ge), gold (Au), copper (Cu), Tin (Sn) or alloys. The cap substrate 104 and the device substrate 102 can be bonded through a metal-to-metal eutectic bonding between the first bonding metal layer 124 and the second bonding metal layer 222. In some alternative embodiments, the cap substrate 104 and the device substrate 102 can be bonded through a semiconductor-to-metal bonding between a semiconductor material and a metal material. In some embodiments, the semiconductor material includes at least one of Ge, Si, SiGe or another semiconductor material. The materials to be bonded are pressed against each other in an annealing process to form a eutectic phase of the materials. For example, a eutectic binding between Ge and Al is formed at an annealing temperature in a range of from about 400° C. to about 450° C.

Figure 17:
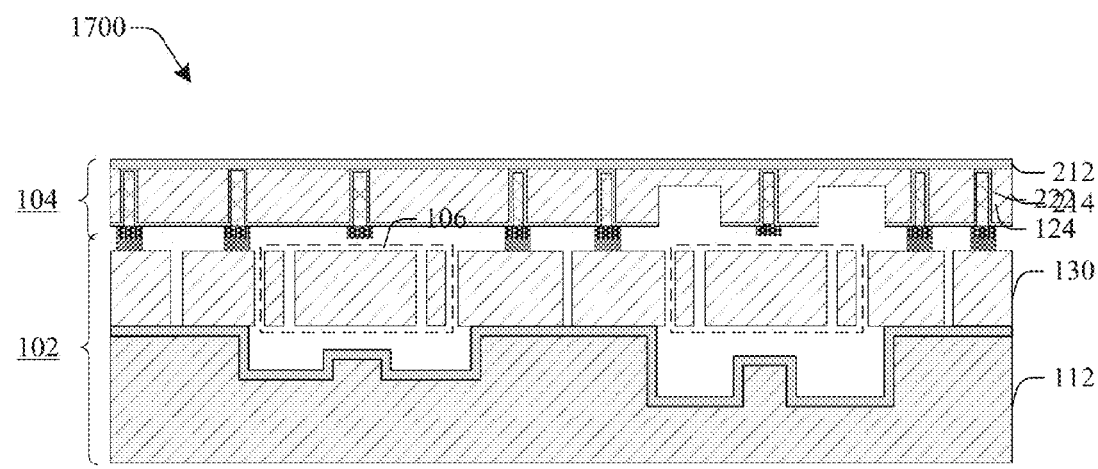

As shown in cross-sectional view 1700 of FIG. 17, the conductive material 220 and the support substrate 230 (shown in FIG. 16) are removed to expose the dielectric layer 212.

Figure 18:
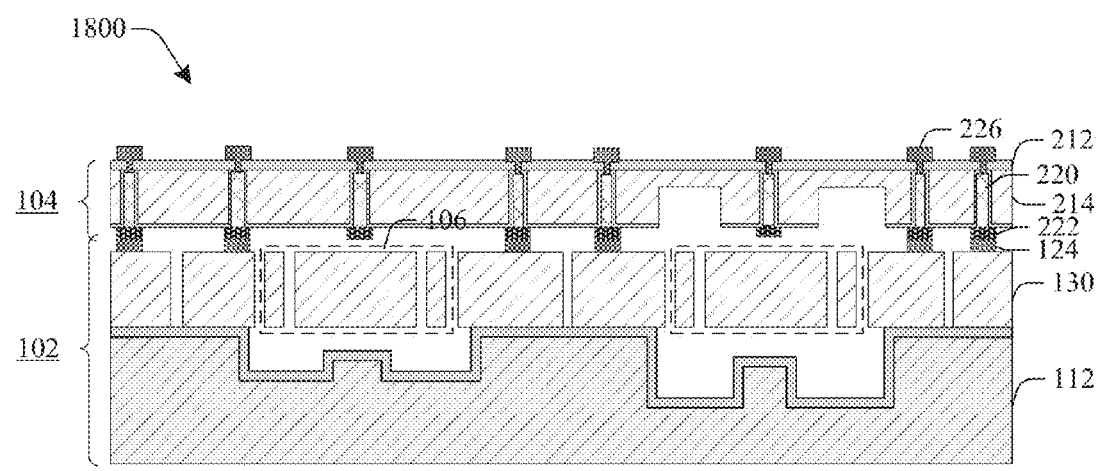

As shown in cross-sectional view 1800 of FIG. 18, the dielectric layer 212 is then patterned to expose at least some portions of the conductive material 220. A plurality of contact pads 226 is deposited and patterned over the dielectric layer 212 at the back side of the cap substrate 104 and in contact with the conductive material 220. The contact pads 226 may be electrically coupled to the first MEMS device 106 or the second MEMS device 108 through the first bonding metal layer 124 and the second bonding metal layer 222.

Figure 19:
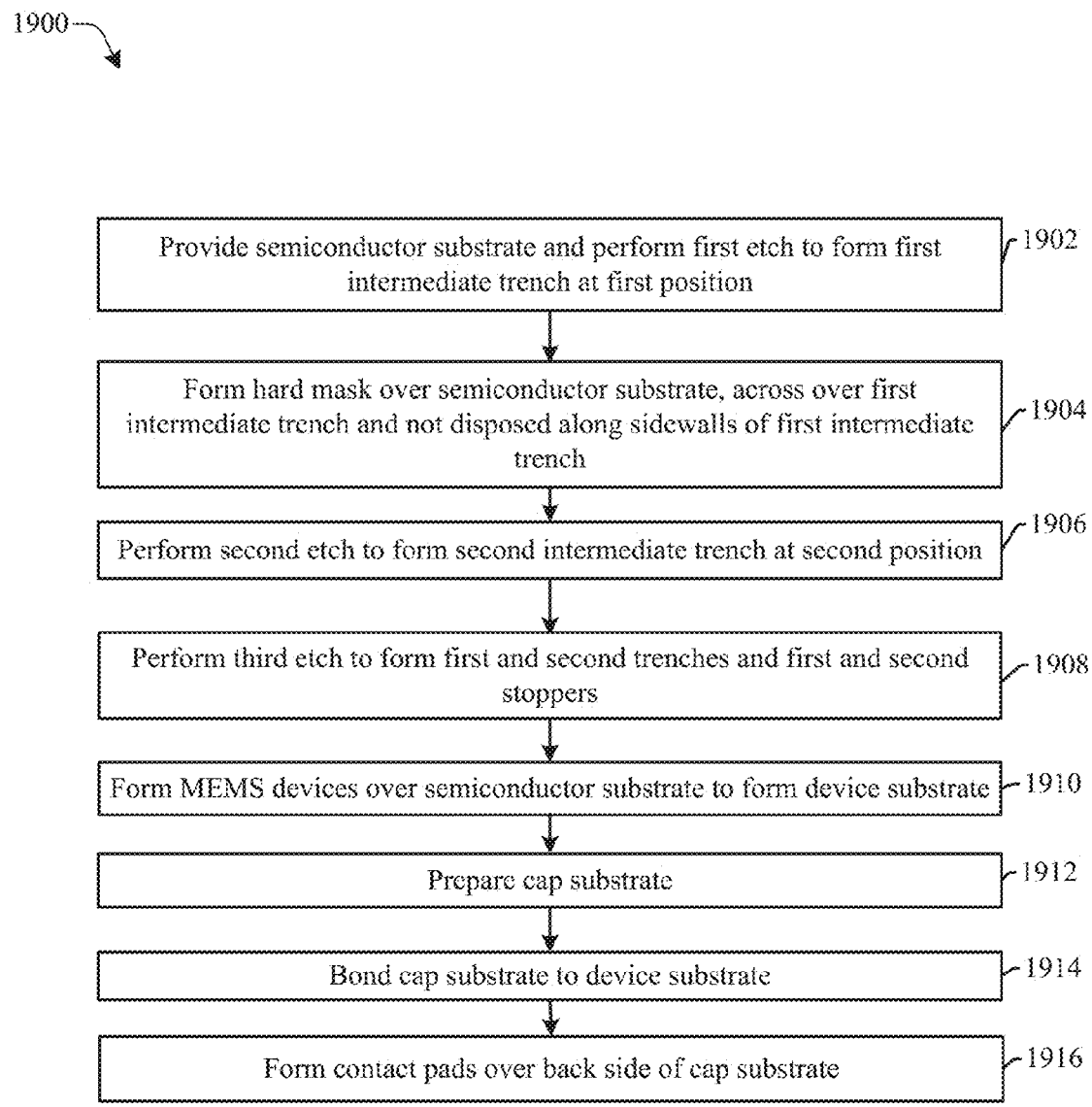
FIG. 19 illustrates a flow diagram of some alternative embodiments of a method for manufacturing a MEMS package.

FIG. 19 shows a flow diagram of a method 1900 for manufacturing a MEMS package according to some embodiments. The MEMS package comprises two MEMS devices configured to work under different pressures. Examples of the MEMS package are shown in FIGS. 2-18.

Although FIGS. 2-18 are described in relation to the method 1900, it will be appreciated that the structures disclosed in FIGS. 2-18 are not limited to the method 1900, but instead may stand alone as structures independent of the method 1900. Similarly, although the method 1900 is described in relation to FIGS. 2-18, it will be appreciated that the method 1900 is not limited to the structures disclosed in FIGS. 2-18, but instead may stand alone independent of the structures disclosed in FIGS. 2-18. Also, while disclosed methods (e.g., methods 1900) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1902, a semiconductor substrate is provided and a first mask layer is formed and patterned over the semiconductor substrate to form a first mask. A first etching process is performed according to the first mask to form a first intermediate trench at a first position corresponding to a first trench to be formed. FIG. 2 illustrates some embodiments of a cross-sectional view 200 corresponding to act 1902.

At 1904, a hard mask is prepared. The hard mask crosses over the first intermediate trench and is not disposed along sidewalls of the first intermediate trench. To form the hard mask, a first intermediate substrate having a hard mask layer disposed thereon is boned to the semiconductor substrate. Then the first intermediate substrate is removed to expose the hard mask layer. The hard mask layer is patterned to exposes a first position corresponding to the first trench and a second position corresponding to a second trench to be formed. The hard mask also exposes first and second stopper positions within the first position and the second position. FIGS. 3-5 illustrate some embodiments of cross-sectional views 300, 400, and 500 corresponding to act 1904.

At 1906, a second etching process is performed according to a second mask to form a second intermediate trench at the second position. The first stopper position within the first intermediate trench and the second stopper position within the second intermediate trench are protected by the second mask from the second etching process. The first intermediate trench is concurrently etched to be deeper by the second etching process. FIG. 6 illustrates some embodiments of a cross-sectional view 600 corresponding to act 1906.

At 1908, a third etching process is performed according to the hard mask formed at act 1904 to further etch the first intermediate trench and the second intermediate trench with the first and second stopper positions exposed and etched concurrently, to form the first trench, the second trench, and a first stopper and a second stopper. FIG. 7 illustrates some embodiments of a cross-sectional view 700 corresponding to act 1908.

At 1910, MEMS devices are formed. A MEMS substrate is bonded to the semiconductor substrate to form a device substrate. For example, the MEMS substrate can be bonded to a first dielectric liner, which is disposed along an upper surface of the semiconductor substrate, by a fusion bonding process. The MEMS substrate is patterned and etched to form a first MEMS device and a second MEMS device. FIGS. 8-10 illustrate some embodiments of cross-sectional views 800, 900, and 1000 corresponding to act 1910.

At 1912, a cap substrate is prepared. A silicon-on-insulator (SOI) substrate is provided including a semiconductor substrate disposed over a dielectric layer and an underneath support substrate. A conductive material is deposited to fill in TSV holes that disposed through the semiconductor substrate and extend over a front side of the semiconductor substrate. A second dielectric liner is conformally deposited along an upper surface of the semiconductor substrate and extended along sidewalls of the TSV holes. A recess is formed in the front side of the cap substrate. FIGS. 11-15 illustrate some embodiments of cross-sectional views 1100, 1200, 1300, 1400 and 1500 corresponding to act 1912.

At 1914, the cap substrate is bonded to the device substrate and the support substrate is removed to expose the dielectric layer. In some embodiments, the cap substrate and the device substrate are bonded through the first bonding metal layer and the second bonding metal layer. FIGS. 16-17 illustrate some embodiments of cross-sectional views 1600 and 1700 corresponding to act 1914.

At 1916, contact pads are formed over the back side of the cap substrate. The dielectric layer is patterned to expose at least some portions of the conductive material. A plurality of contact pads is deposited and patterned over the dielectric layer at the back side of the cap substrate and in contact with the conductive material. The contact pads may be electrically coupled to the first MEMS device or the second MEMS device through the first bonding metal layer and the second bonding metal layer. FIGS. 17-18 illustrate some embodiments of cross-sectional views 1700 and 1800 corresponding to act 1916.

Thus, as can be appreciated from above, the present disclosure relates to a MEMS package and associated methods.

In some embodiments, the present disclosure relates a MEMS package. The MEMS package comprises a device substrate comprising a first trench and a second trench. The MEMS package further comprises a first MEMS device disposed over the first trench and a second MEMS device disposed over the second trench. The MEMS package further comprises a cap substrate bonded to the device substrate, enclosing a first cavity over the first MEMS device and a second cavity over the second MEMS device. A first stopper is raised from a first trench bottom surface of the first trench but below a top surface of the device substrate and a second stopper is raised from a second trench bottom surface of the second trench but below the top surface of the device substrate. a first depth of the first trench is greater than a second depth of the second trench.

In other embodiments, the present disclosure relates to a method for manufacturing a microelectromechanical systems (MEMS) package. The method comprises forming a first trench and a second trench in a front side of a device substrate. A first depth of the first trench is greater than a second depth of the second trench. The method further comprises providing a first MEMS device overlying the first trench and a second MEMS device overlying the second trench. The method further comprises forming a recess in a front side of a cap substrate and bonding the front side of the cap substrate to the front side of the device substrate. When the cap substrate and device substrate are bonded, a first cavity which includes the first trench is formed between the front side of the cap substrate and device substrate and encloses the first MEMS device, and a second cavity which includes the recess and the second trench is formed between the cap substrate and the device substrate and encloses the second MEMS device.

In yet other embodiments, the present disclosure relates to a method for manufacturing a microelectromechanical systems (MEMS) package. The method comprises providing a device substrate and performing a first etching process on the device substrate according to a first mask to form a first intermediate trench. The method further comprises providing a first intermediate substrate including a hard mask layer disposed thereon, and bonding the first intermediate substrate to the device substrate through a fusion bond between the hard mask layer and the device substrate, the hard mask layer overlying the first intermediate trench. The method further comprises removing the first intermediate substrate to expose the hard mask layer and patterning the hard mask layer to form a hard mask, which exposes first and second positions of first and second trenches to be formed. The method further comprises performing a second etching process according to a second mask to form a second intermediate trench, wherein the first intermediate trench is concurrently etched to be deeper by the second etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a microelectromechanical systems (MEMS) package, the method comprising:
   forming a first trench and a second trench in a front side of a device substrate, wherein a first depth of the first trench is greater than a second depth of the second trench;
   providing a first MEMS device overlying the first trench and a second MEMS device overlying the second trench;
   forming a recess in a front side of a cap substrate and bonding the front side of the cap substrate to the front side of the device substrate;
   wherein, when the cap substrate and device substrate are bonded, a first cavity which includes the first trench is formed between the front side of the cap substrate and device substrate and encloses the first MEMS device, and a second cavity which includes the recess and the second trench is formed between the cap substrate and the device substrate and encloses the second MEMS device.

2. The method of claim 1, wherein the first trench and the second trench are formed in the device substrate by a process comprising:
   performing a first etching process according to a first mask to form a first intermediate trench at a first position wherein the first trench is to be formed, wherein a first stopper position within the first intermediate trench is protected by the first mask from etching;
   performing a second etching process according to a second mask to form a second intermediate trench at a second position wherein the second trench is to be formed, wherein a second stopper position within the second intermediate trench is protected by the second mask from etching, and the first intermediate trench is concurrently etched to be deeper by the second etching process; and
   performing a third etching process into the first intermediate trench and the second intermediate trench with the first and second stopper positions exposed, to form the first trench, the second trench, and first and second stoppers.

3. The method of claim 2, wherein the first depth is in a range of from about 40 μm to about 60 μm, the second depth is in a range of from about 20 μm to about 30 μm, and a vertical height from a top surface of the device substrate to the first or second stopper is in a range of from about 5 µm to about 10 µm.

4. The method of claim 2, wherein a hard mask for the third etching process is formed prior to performing the second etching process.

5. The method of claim 4, wherein after the first etching process, the hard mask is formed by:
providing a first intermediate substrate having a hard mask layer disposed thereon;
bonding the first intermediate substrate to the device substrate through a fusion bond between the hard mask layer and the device substrate, the hard mask layer overlying the first intermediate trench;
removing the first intermediate substrate to expose the hard mask layer; and
patterning the hard mask layer to form the hard mask, which exposes the first and second positions and the first and second stopper positions.

6. The method of claim 1, wherein the cap substrate is formed by a process comprising:
forming a plurality of through substrate via (TSV) holes extending through the cap substrate;
forming a plurality of polysilicon pillars within the plurality of TSV holes;
forming a second bonding metal layer at a front side of the cap substrate including a bonding pad disposed at a position corresponding to a first bonding metal layer of the device substrate and an upper stopper disposed at a position corresponding to the first MEMS device or the second MEMS device to be enclosed; and
forming a contact pad disposed at a back side of the cap substrate and in contact with the polysilicon pillars and electrically coupled to the first or second MEMS device through the first bonding metal layer and the second bonding metal layer.

7. The method of claim 1, wherein the cap substrate is formed by a process comprising:
providing a second intermediate substrate having a dielectric layer disposed over a support substrate and a silicon layer disposed over the dielectric layer;
forming a plurality of polysilicon pillars through the silicon layer and in contact with the dielectric layer;
forming a second bonding metal layer at a front side of the silicon layer and in contact with the plurality of polysilicon pillars; and
bonding the silicon layer to the device substrate through the second bonding metal layer and a first bonding metal layer of the device substrate;
removing the support substrate to expose the dielectric layer; and
forming a contact pad over the dielectric layer and in contact with the polysilicon pillars.

8. The method of claim 7, wherein the silicon layer has a thickness in a range of from about 40 µm to about 60 µm.

9. A method for manufacturing a microelectromechanical systems (MEMS) package, the method comprising:
providing a device substrate and performing a first etching process on the device substrate according to a first mask to form a first intermediate trench;
providing a first intermediate substrate including a hard mask layer disposed thereon, and bonding the first intermediate substrate to the device substrate through a fusion bond between the hard mask layer and the device substrate, the hard mask layer overlying the first intermediate trench;
removing the first intermediate substrate to expose the hard mask layer;
patterning the hard mask layer to form a hard mask, which exposes first and second positions of first and second trenches to be formed; and
performing a second etching process according to a second mask to form a second intermediate trench, wherein the first intermediate trench is concurrently etched to be deeper by the second etching process.

10. The method of claim 9,
wherein a first stopper position within the first intermediate trench and a second stopper position within the second intermediate trench are protected by the first and second masks from the first and second etching processes;
wherein a third etching process is performed to the first intermediate trench and the second intermediate trench with the first and second stopper positions exposed, to form the first trench, the second trench, and first and second stoppers.

11. The method of claim 9, further comprising:
forming a first MEMS device overlying the first trench and a second MEMS device overlying the second trench;
providing a cap substrate and bonding the cap substrate to the device substrate, enclosing the first MEMS device over the first trench to form a first cavity having a first pressure, and enclosing the second MEMS device over the second trench to form a second cavity having a second pressure different from the first pressure.

12. The method of claim 11, further comprising:
forming a plurality of trenches extending through the cap substrate;
forming a plurality of polysilicon pillars within the plurality of trenches;
forming a second bonding metal layer at a front side of the cap substrate including a bonding pad corresponding to a first bonding metal layer of the device substrate and an upper stopper at a position corresponding to the first MEMS device or the second MEMS device to be enclosed; and
forming a contact pad disposed at a back side of the cap substrate and in contact with the polysilicon pillars and electrically coupled to the first or second MEMS device through the first and second bonding metal layers.

13. The method of claim 11, further comprising:
providing a second intermediate substrate having a dielectric layer disposed over a support substrate and a silicon layer disposed over the dielectric layer;
bonding the silicon layer to the device substrate through a first bonding metal layer and a second bonding metal layer;
removing the support substrate to expose the dielectric layer; and
forming a contact pad over the dielectric layer and electrically coupled to the first or second MEMS device.

14. The method of claim 13, further comprising:
forming a recess in a front side of the cap substrate prior to bonding the cap substrate to the device substrate, wherein the recess is located at a position overlying the first MEMS device and configured as a part of the first cavity.

15. The method of claim 14, wherein the recess has a ring shape with a raised platform disposed inside the ring shape and coplanar with a top surface of the cap substrate, and a portion of the second bonding metal layer is formed on the raised platform, and acts as an upper stopper to prevent over movement or stiction of the first MEMS device.

16. A method for manufacturing a microelectromechanical systems (MEMS) package, the method comprising:
    forming a device substrate comprising a first trench and a second trench;
    forming a first MEMS device over the first trench and a second MEMS device over the second trench; and
    bonding a cap substrate to the device substrate, enclosing a first cavity over the first MEMS device and a second cavity over the second MEMS device;
    wherein a first stopper is raised from a first trench bottom surface of the first trench but below a top surface of the device substrate and a second stopper is raised from a second trench bottom surface of the second trench but below the top surface of the device substrate;
    wherein a first depth of the first trench is greater than a second depth of the second trench.

17. The method of claim 16, wherein top surfaces of the first stopper and the second stopper are formed coplanar with each other.

18. The method of claim 16, wherein the second cavity is formed to have a second pressure that is different from a first pressure of the first cavity.

19. The method of claim 16, wherein the device substrate and the cap substrate are bonded through a first bonding metal layer disposed on the device substrate and a second bonding metal layer, wherein a portion of the second bonding metal layer is disposed directly above the first or second MEMS device and configured as an upper stopper to prevent over movement or stiction of the first or second MEMS device.

20. The method of claim 19, further comprising:
    forming a polysilicon pillar extending through the cap substrate and electrically coupled to the first MEMS device or the second MEMS device through the first bonding metal layer and the second bonding metal layer; and
    forming a contact pad disposed at a back side surface of the cap substrate and in contact with the polysilicon pillar.

\* \* \* \* \*